(12) United States Patent
Ko et al.

(10) Patent No.: US 11,069,541 B2
(45) Date of Patent: Jul. 20, 2021

(54) SEMICONDUCTOR DEVICE PACKAGE FOR DEBONDING SUBSTRATE ASSEMBLY FROM CARRIER SUBSTRATE USING LIGHT AND METHOD OF MANUFACTURING SAME

(71) Applicant: SAMSUNG ELECTRONICS CO., LTD., Suwon-si (KR)

(72) Inventors: Yeong Kwon Ko, Suwon-si (KR); Jun Yeong Heo, Suwon-si (KR); Un Byoung Kang, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/549,818

(22) Filed: Aug. 23, 2019

(65) Prior Publication Data
US 2020/0126814 A1   Apr. 23, 2020

(30) Foreign Application Priority Data
Oct. 23, 2018 (KR) .......................... 10-2018-0126545

(51) Int. Cl.
| | |
|---|---|
| *H01L 21/56* | (2006.01) |
| *H01L 23/31* | (2006.01) |
| *H01L 21/683* | (2006.01) |

(52) U.S. Cl.
CPC ......... *H01L 21/568* (2013.01); *H01L 21/565* (2013.01); *H01L 21/6835* (2013.01); *H01L 23/3128* (2013.01); *H01L 2221/68313* (2013.01); *H01L 2221/68381* (2013.01)

(58) Field of Classification Search
CPC . H01L 21/568; H01L 23/3128; H01L 21/565; H01L 21/6835; H01L 2221/68381; H01L 2221/68313; H01L 2924/15311; H01L 2224/16225; H01L 2924/181; H01L 2924/0012; H01L 21/56; H01L 23/31; H01L 21/683
USPC ........................................................ 257/787
See application file for complete search history.

(56) References Cited

U.S. PATENT DOCUMENTS

| | | | |
|---|---|---|---|
| 6,371,664 B2 * | 4/2002 | Takahashi ............ | G02B 6/4239 385/33 |
| 8,579,678 B2 | 11/2013 | Omomoto | |
| 8,580,655 B2 | 11/2013 | Martin et al. | |
| 8,748,229 B2 * | 6/2014 | Nishimura .............. | H01L 24/75 438/108 |

(Continued)

FOREIGN PATENT DOCUMENTS

JP     2008060255 A     3/2008

*Primary Examiner* — Alexander O Williams
(74) *Attorney, Agent, or Firm* — Volentine, Whitt & Francos, PLLC

(57) ABSTRACT

A method for manufacturing a semiconductor device package includes: accommodating a substrate in a cavity in a center of a carrier substrate having the cavity in which a substrate with a semiconductor chip mounted thereon is accommodated in the center, having a support portion in contact with a side wall of the cavity to form an upper surface of the side wall and surrounding the cavity, and formed of a light-transmitting material; defining a molding portion of the substrate by pressing the support portion and an edge region of the substrate; and molding the molding portion, to cover the semiconductor chip.

20 Claims, 7 Drawing Sheets

(56) References Cited

U.S. PATENT DOCUMENTS

| | | | |
|---|---|---|---|
| 9,087,873 B2 | 7/2015 | Owada | |
| 9,209,081 B2* | 12/2015 | Lim | H01L 24/19 |
| 9,282,261 B2* | 3/2016 | Igarashi | H01L 27/14618 |
| 9,576,835 B2 | 2/2017 | Wei et al. | |
| 9,666,776 B2* | 5/2017 | Takada | H01L 33/62 |
| 9,678,271 B2* | 6/2017 | Thacker | G02B 6/4257 |
| 9,768,153 B2* | 9/2017 | Inoguchi | H01L 33/60 |
| 9,773,660 B2 | 9/2017 | Kim et al. | |
| 10,672,724 B2* | 6/2020 | Yamamoto | H01L 27/14618 |
| 2010/0090235 A1* | 4/2010 | Wang | H01L 33/486 257/98 |
| 2010/0099208 A1* | 4/2010 | Harada | H01L 33/508 438/27 |
| 2013/0193458 A1* | 8/2013 | Mochizuki | H01L 27/15 257/88 |
| 2013/0221388 A1* | 8/2013 | Tanaka | H01L 21/0237 257/98 |
| 2014/0227834 A1* | 8/2014 | Karpman | H01L 25/0652 438/126 |
| 2015/0179970 A1* | 6/2015 | Zhang | H01L 51/524 257/40 |
| 2015/0235935 A1* | 8/2015 | Lin | H01L 23/49827 257/693 |
| 2016/0061677 A1* | 3/2016 | Han | G01L 9/0045 257/415 |
| 2016/0233165 A1* | 8/2016 | Oganesian | H01L 25/0657 |
| 2017/0009959 A1* | 1/2017 | Shida | G06F 1/1637 |
| 2018/0005993 A1* | 1/2018 | Chen | H01L 24/17 |
| 2018/0019365 A1 | 1/2018 | Jonczyk et al. | |
| 2018/0040500 A1 | 2/2018 | Goossens et al. | |
| 2018/0040551 A1* | 2/2018 | Lin | H01L 23/16 |
| 2018/0138163 A1 | 5/2018 | Lu | |
| 2018/0182727 A1* | 6/2018 | Yu | H01L 23/06 |
| 2018/0301604 A1* | 10/2018 | Liu | H01L 33/60 |
| 2018/0337135 A1* | 11/2018 | Yoshihiro | H01L 24/81 |
| 2018/0337160 A1* | 11/2018 | Drab | H01L 21/561 |
| 2019/0206782 A1* | 7/2019 | Kumar | H01L 24/16 |
| 2020/0135597 A1* | 4/2020 | Boone | H01L 23/49838 |
| 2020/0219815 A1* | 7/2020 | Elsherbini | H01L 23/3675 |
| 2020/0227394 A1* | 7/2020 | Yeh | H01L 21/565 |

* cited by examiner

I-I'

SEMICONDUCTOR DEVICE PACKAGE FOR DEBONDING SUBSTRATE ASSEMBLY FROM CARRIER SUBSTRATE USING LIGHT AND METHOD OF MANUFACTURING SAME

CROSS-REFERENCE TO RELATED APPLICATION(S)

A claim of priority is made to Korean Patent Application No. 10-2018-0126545 filed on Oct. 23, 2018, in the Korean Intellectual Property Office, the disclosure of which is incorporated herein by reference in its entirety.

BACKGROUND

The present inventive concept relates to a semiconductor device package and a method of manufacturing the same.

In a process of manufacturing a semiconductor device package, in order to protect a semiconductor device mounted on a substrate, an encapsulation portion is formed through a molding process. In the molding process described above, a clamp is in contact with a surface of a substrate to define a molding portion, and an encapsulant in a liquid is injected into the molding portion, defined by the clamp. Generally, the substrate is subjected to a relatively high pressure by the clamp in contact therewith, which can cause cracking of the substrate in a region of the clamp. This problem is exacerbated as the thicknesses of the substrates are reduced with advancements in manufacturing processes.

SUMMARY

According to an aspect of the present inventive concept, a method for manufacturing a semiconductor device package includes: accommodating a substrate in a cavity in a center of a carrier substrate having the cavity in which a substrate with a semiconductor chip mounted thereon is accommodated in the center, having a support portion in contact with a side wall of the cavity to form an upper surface of the side wall and surrounding the cavity, and formed of a light-transmitting material; defining a molding portion of the substrate by pressing the support portion and an edge region of the substrate; and molding the molding portion, to cover the semiconductor chip.

According to an aspect of the present inventive concept, a method for manufacturing a semiconductor device package includes: accommodating a substrate in a cavity in a center of a carrier substrate, the cavity being defined by a side wall protruding along an edge and in which a substrate is accommodated, and including a base formed of a light-transmitting material, an upper surface of the side wall forming a surface substantially parallel with an upper surface of the substrate, and a level of the upper surface being the same as or lower than a level of the substrate; defining a molding portion of the substrate by pressing the support portion and an edge region of the substrate to be coplanar with each other, using a clamp defining a region in which the substrate is to be molded; and molding the molding portion, to cover the semiconductor device.

According to an aspect of the present inventive concept, a semiconductor device package includes: a substrate having one surface on which at least one semiconductor device is mounted; and a molding portion disposed on the one surface to cover the semiconductor device, wherein the substrate has a cavity in the central portion, is in contact with a side wall of the cavity to form an upper surface of the side wall, has a support portion surrounding the cavity, and is accommodated in the cavity in a center of a carrier substrate formed of a light-transmitting material, and the molding portion is disposed in a region defined by a clamp in contact with the one surface and the support portion while being coplanar therewith.

BRIEF DESCRIPTION OF DRAWINGS

The above and other aspects, features and other advantages of the present disclosure will be more clearly understood from the detailed description that follows, taken in conjunction with the accompanying drawings, in which.

DETAILED DESCRIPTION

Hereinafter, the example embodiments of the present disclosure will be described in detail with reference to the attached drawings.

Figure 1:
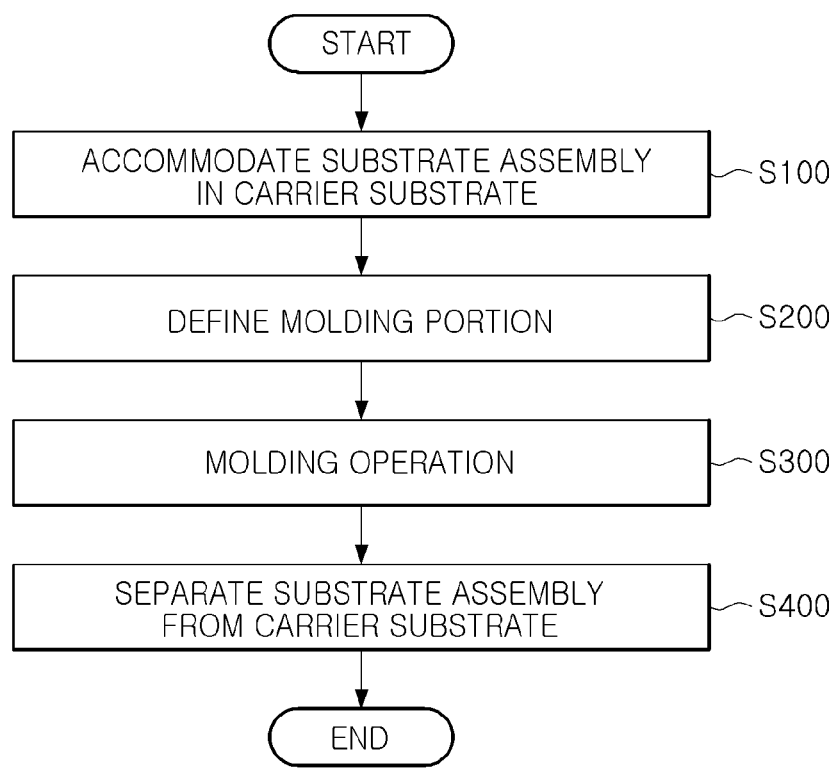
FIG. 1 is a flow chart illustrating a method of manufacturing a semiconductor device package according to an example embodiment.

FIG. 1 is a flow chart illustrating a method of manufacturing a semiconductor device package according to an example embodiment, and FIGS. 2 to 7 are views illustrating a method of manufacturing a semiconductor device package according to an example embodiment.

Figure 2:
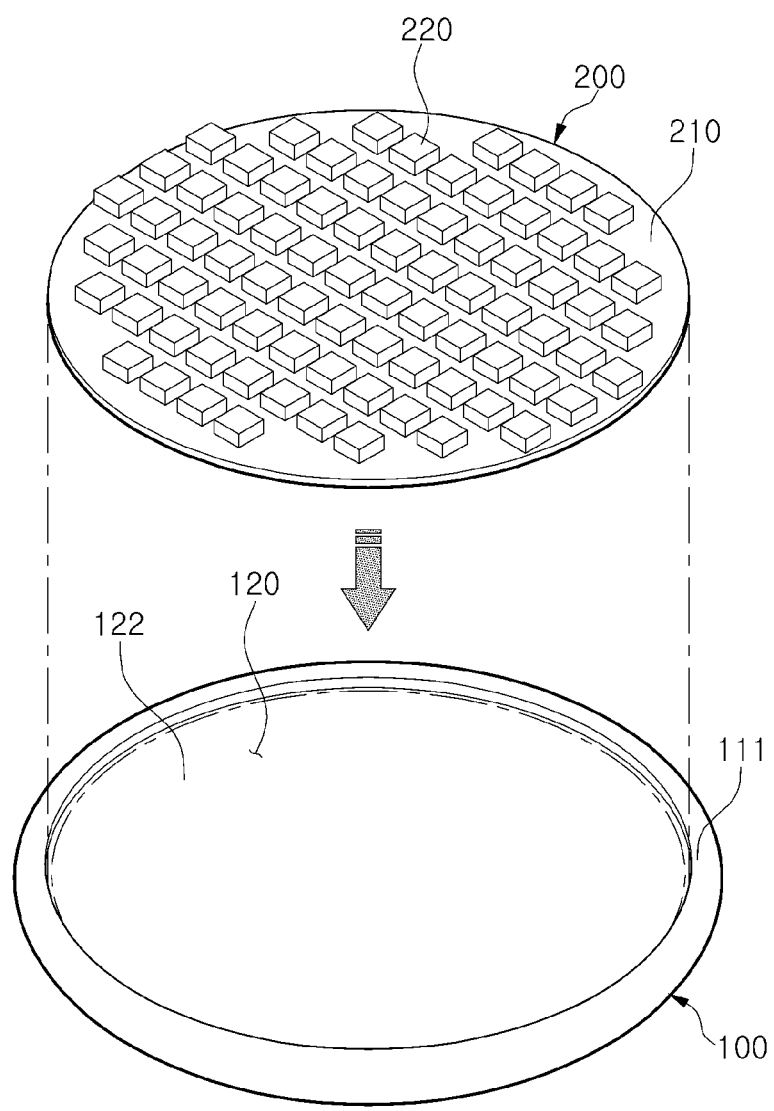
FIGS. 2 to 7 are views illustrating a method of manufacturing a semiconductor device package according to an example embodiment.
Figure 3:
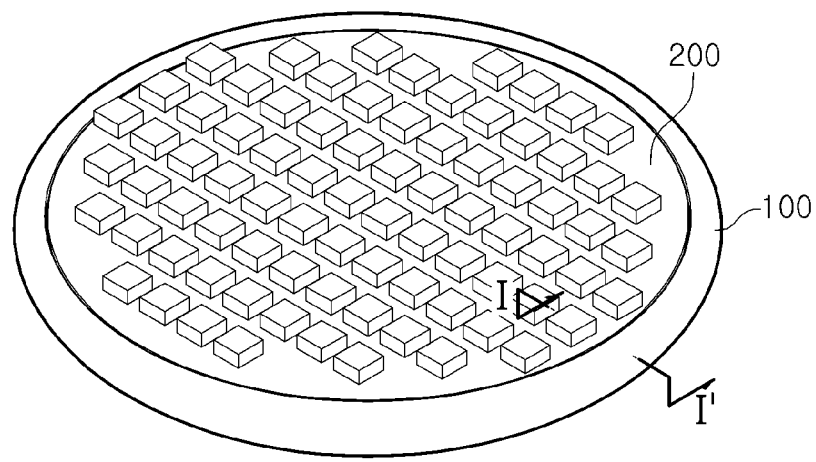
Figure 4:
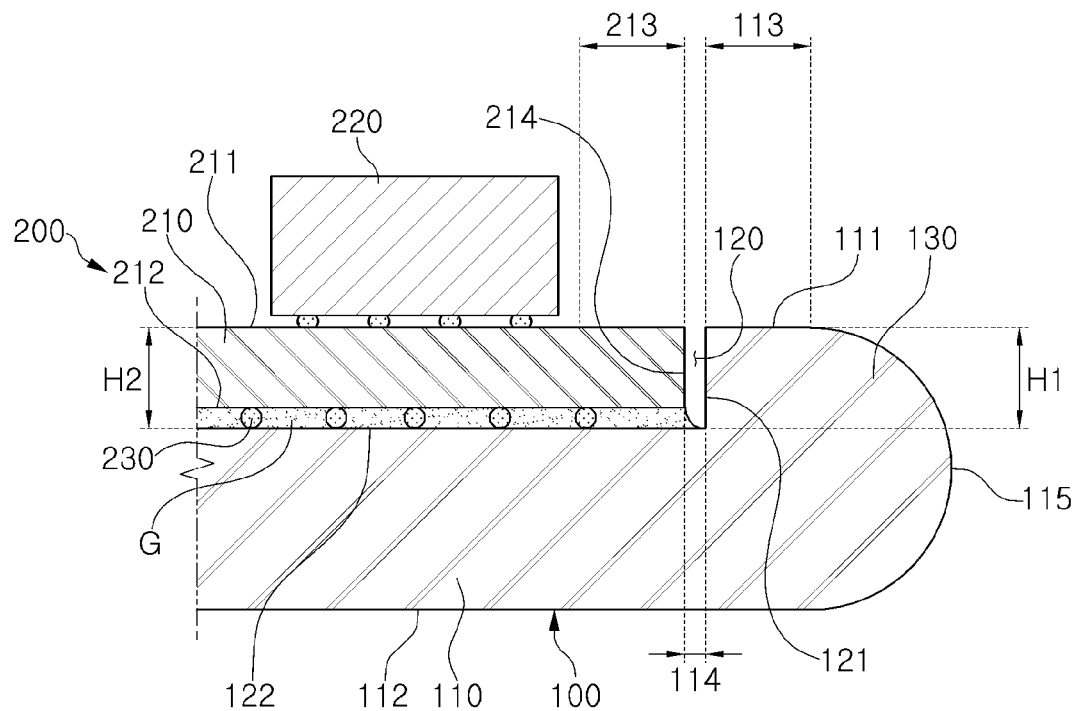

Referring to FIG. 1, a method of manufacturing a semiconductor device package according to an example embodiment includes: accommodating a substrate assembly in a carrier substrate having a cavity (S100); defining a molding portion of the substrate assembly (S200); molding the accommodated substrate assembly (S300); and separating the substrate assembly from the carrier substrate (S400). First, an operation S1 of accommodating a substrate assembly 200 in a carrier substrate 100 may be performed. FIG. 2 illustrates a process of accommodating the substrate assembly 200 in the carrier substrate 100, and FIG. 3 illustrates the substrate assembly 200 being accommodated in a carrier substrate 100. FIG. 4 is a view taken along line I-I' of FIG. 3.

The carrier substrate 100 according to an example embodiment is attached a substrate assembly 200 for processing of the substrate assembly 200, and in particular, the carrier substrate 100 serves as a support for supporting the substrate assembly 200 during processing. For example, the carrier substrate 100 may serve to support the substrate assembly 200 in a molding process in which a semiconductor chip 220 mounted on a surface of the substrate assembly 200 is encapsulated using a mold.

The substrate assembly 200 is provided by mounting or forming a plurality of semiconductor chips 220 on the substrate 210. The substrate 210 may be one among a semiconductor wafer, or a printed circuit board (PCB). However, the embodiments are not limited to these examples of the substrate 210, and various other types of substrates may be adopted so long as they are capable of having semiconductor chips 220 mounted or formed thereon. Likewise, the embodiments are not limited to any particular type of semiconductor chip 220, so long as the type of semiconductor chip 220 is capable of being mounted or formed on the substrate 210.

Referring to FIG. 4, the substrate 210 may have an upper surface 211 on which the semiconductor chip 220 is mounted, and a lower surface 212 attached to the carrier substrate 100. A bump 230 is attached to the lower surface 212. The substrate assembly 200 may include a plurality of via electrodes passing through an interior thereof in a thickness direction, and the semiconductor chip 220 mounted on the upper surface 211 and the bump 230 in the lower surface 212 may be electrically connected to each other through the plurality of via electrodes. An edge region 213 of the substrate 210 is a region where a clamp contacts the substrate 210 in the molding process for molding the semiconductor chip 220 mounted on the surface of the substrate 210.

The substrate assembly 200 is attached to the carrier substrate 100 before a molding process of molding the semiconductor chip 220, mounted on a surface of the substrate assembly 200. Here, the substrate assembly 200 is attached to the carrier substrate 100 before the molding process is performed, but is not necessarily attached thereto in a process immediately before the molding process. For example, the substrate assembly 200 may be attached to the carrier substrate 100 in an earlier back lap process for grinding the substrate 210 to allow a thickness of the substrate assembly 200 to be reduced. The substrate assembly 200 may be attached to the carrier substrate 100 through an adhesive layer G disposed on the lower surface 212 of the substrate 210. The adhesive layer G may be formed by applying an adhesive material in liquid form to a bottom surface 122 of the cavity 120, or may be formed by attaching an adhesive material in the form of a film to the bottom surface 122 of the cavity 120. The adhesive material may be a photodegradable adhesive, of which adhesion becomes weak when light is irradiated thereonto. In an example embodiment, the adhesive layer G may be formed by applying a photodegradable adhesive, of which adhesion becomes weak when UV light is irradiated thereonto. Thus, when UV light is irradiated onto the adhesive layer G, adhesion becomes weak, so the substrate assembly 200 may be debonded from the carrier substrate 100.

Referring to FIGS. 3 and 4, the carrier substrate 100 may include a cavity 120 in which the substrate 210 of the substrate assembly 200 is accommodated in a central portion of the carrier substrate 100, and a base 110 having a support portion 113 surrounding the cavity 120.

The base 110 has a first surface 111 and a second surface 112 opposite thereto, and may have an edge 115 that is circular when viewed from above. The edge 115 may have a rounded cross section 130 as shown in FIG. 3. The first surface 111 and the second surface 112 of the base 110 may be provided as a flat surface, and the first surface 111 and the second surface 112 may be formed to be substantially parallel to each other. As illustrated in FIG. 4, a height H1 of the support portion 113 may be arranged to be substantially equal to the sum of a heights H2 of the substrate 210 and the adhesive layer G.

The base 110 may be formed of a light-transmitting material, and may be formed of a material containing, for example, at least one among glass, fused silica, and fused quartz. Thus, when the substrate assembly 200 is attached to the carrier substrate 100 through a photodegradable adhesive material, light is irradiated through the second surface 112 of the base 110, so the substrate assembly 200 may be debonded from the carrier substrate 100.

A cavity 120, in which the substrate 210 of the substrate assembly 200 is accommodated, is provided in a central portion of the first surface 111. The bottom surface 122 of the cavity 120 may be formed to have a flat surface, and the first surface 111 and the second surface 112 may be formed to be substantially parallel to each other.

The cavity 120 may be formed to have sufficient space to accommodate the substrate 210, and may be provided to allow the side surface 214 of the substrate 210 and the side wall 121 of the cavity 120 to be separated from each other by a separation space 114.

The support portion 113, forming an upper surface of the side wall 121, may be provided around the cavity 120. The support portion 113 is extended from the side wall 121 to form the upper surface of the side wall 121, and may be disposed in one region of the first surface 111 of the base 110. The upper surface of the support portion 113 may be disposed to be substantially coplanar with the upper surface 211 of the substrate 210.

Figure 9:
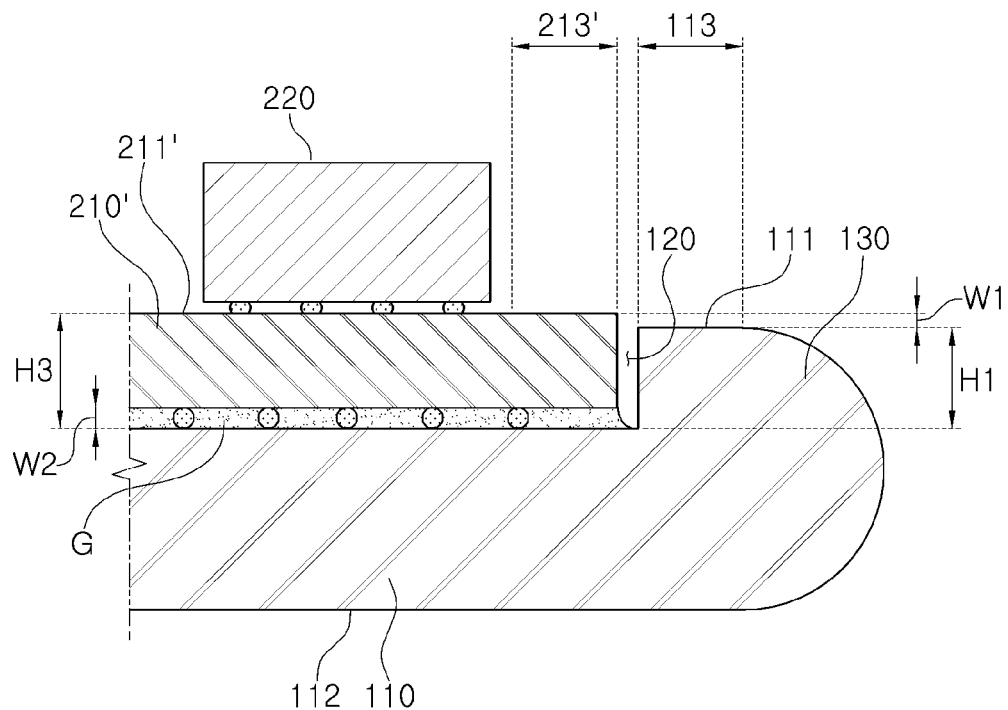
FIGS. 9 to 12 illustrate various modifications of a carrier substrate used in a method of manufacturing a semiconductor device package according to an example embodiment.

Here, according to an example embodiment, as illustrated in FIG. 9, the height H1 of the support portion 113 may be provided to be lower than a height H3, where the height H3 is the sum of heights of a substrate 210' and the adhesive layer G. In other words, the support portion 113 may be disposed to be lower than the upper surface 211' of the substrate 210' by W1. In this case, a thickness W2 of the adhesive layer G is provided to be greater than W1. In this regard, when the upper surface 211' of the substrate 210' is pressed by the clamp in a molding process, due to elasticity of the adhesive layer G, the upper surface 211' of the substrate 210' and the support portion 113 may be coplanar with each other. An edge region 213' of the substrate 210' is a region where a clamp contacts the substrate 210' in the molding process for molding the semiconductor chip 220 mounted on the surface of the substrate 210'.

Figure 5:
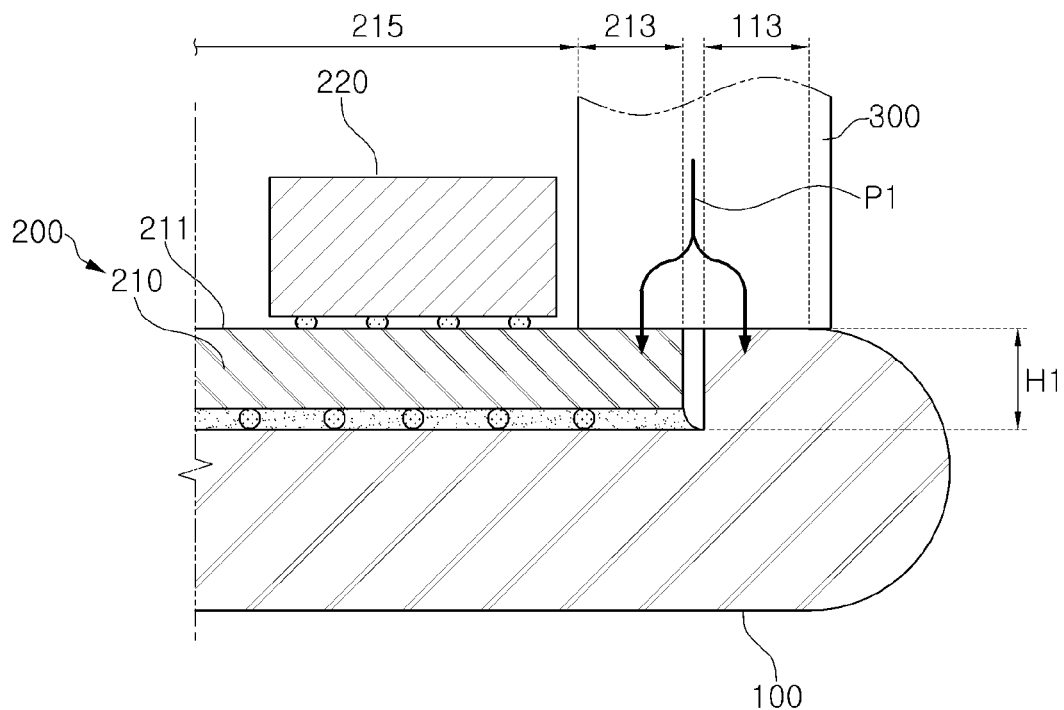

Next, as illustrated in FIG. 5, an operation S200 of defining a molding portion of the substrate assembly 200 accommodated in the carrier substrate 100 may be performed.

The operation of defining a molding portion may be an operation of defining a region in which an encapsulant is to be molded in a subsequent process, by pressing the support unit 113 and the edge region 213 of the substrate 210 by the clamp 300.

Figure 8:
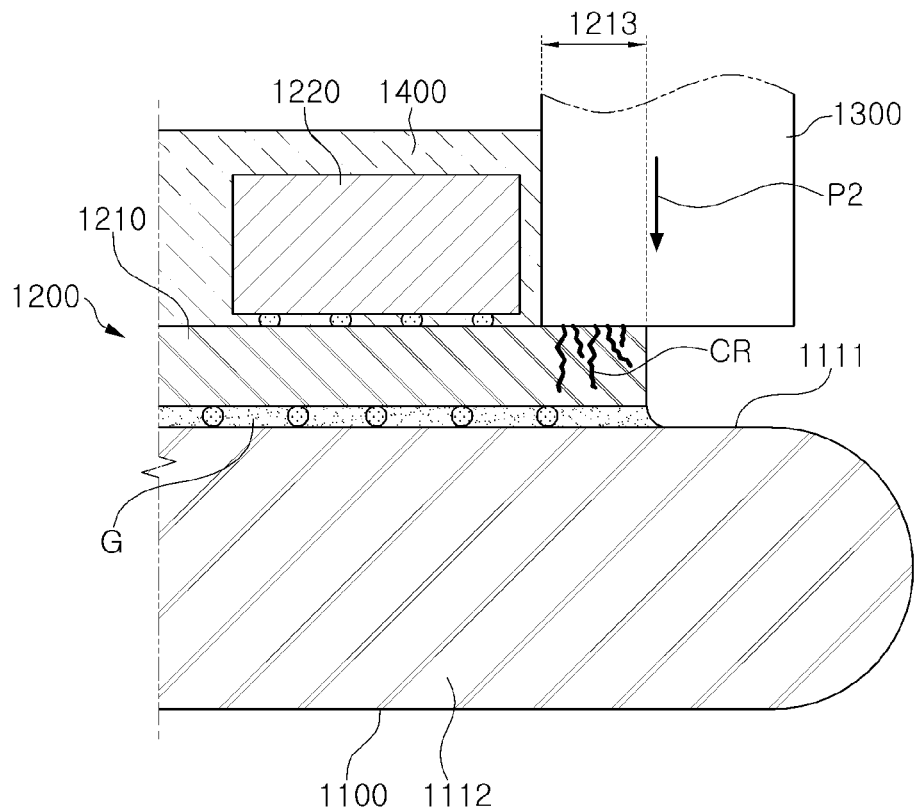
FIG. 8 illustrates a comparative example of an example embodiment.

The support portion 113 is a region directly in contact with the clamp 300 in a molding process of molding the substrate assembly 200 (see FIG. 4), and may prevent the substrate assembly 200 from being damaged by the clamp 300 in the molding process. A molding process of high pressure molding a surface using an encapsulant is performed on a substrate assembly with a semiconductor chip mounted thereon, in order to secure structural reliability of a semiconductor chip mounted thereon. In this case, as in the comparative example of FIG. 8, when a cavity is not formed in the carrier substrate 1100, a molding process is performed on the substrate assembly 1200 attached to the first surface 1111 of the carrier substrate 1100. The clamp 1300 is lifted and lowered in an upper portion of the carrier substrate 1100 and is in contact with the substrate 1210, in order to define a region to be molded in the substrate assembly 1200. Moreover, in order to prevent the encapsulant 1400 from leaking between the clamp 1300 and the substrate 1210 during high pressure molding, the substrate 1210 of the substrate assembly 1200 is pressed at a predetermined pressure P2. Thus, the clamp 1300 presses an edge region 1213 of the substrate 1210 which relatively weak to shock. During the process described above, cracking CR occurs in the edge region 1213 of the substrate 1210. The edge region 1213 of the substrate 1210 is a region to be removed in a process in which the substrate assembly 200 is diced into individual elements. However, if the cracking CR is extended into a region of individual elements not to be removed in a dicing process, a molding process may be incompletely performed. Thus, a problem in which molding failure occurs and reliability of manufactured individual elements is reduced may occur.

On the other hand, as illustrated in FIG. 5, in an example embodiment, the support portion 113 of the carrier substrate 100 is in contact with the clamp 300 in a molding process, so a pressure P1, pressed by the clamp 300, may be dispersed into the support portion 133. Thus, the pressure applied to the edge region 213 of the substrate 210 may be reduced when compared to the comparative example of FIG. 6. In other words, the support portion 113 is coplanar with the upper surface 211 of the substrate 210 by pressing force of the clamp 300, and a portion of the pressure, applied to the substrate 210, may be dispersed into the carrier substrate 100.

Moreover, the support portion 113 of the carrier substrate 100 supports a lower portion of the clamp 300. In this regard, a situation may be prevented in which the clamp 300 is lowered by a height less than the height H1 of the support portion 113 to press the substrate 210 of the substrate assembly 200. In detail, if a deviation occurs in a thickness of the substrate 210 in a back lap process of grinding the substrate 210, a distance between the clamp 300 and the substrate 210 may be non-uniform according to a region of the substrate 210. If the deviation occurs in a thickness of the substrate 210, and the thickness of the substrate becomes greater than a desired thickness, the support portion 113 according to an example embodiment limits a height by which the clamp 300 is lowered. Thus, excessive pressing of the clamp 300 substrate 210 may be prevented.

Thus, in an example embodiment, cracking may be prevented from occurring in the substrate 210 of the substrate assembly 200. Moreover, when the substrate assembly 200 is attached to the carrier substrate 100 through a photodegradable adhesive material, light (L) is irradiated through the carrier substrate 100, so the substrate assembly 200 may be debonded from the carrier substrate 100.

Figure 6:
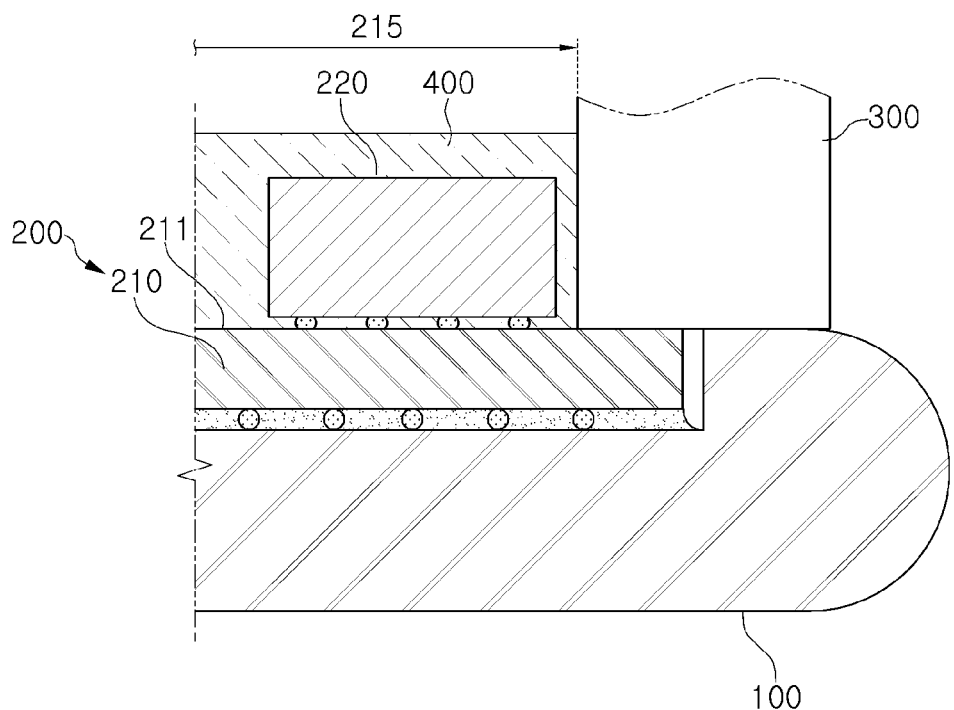

Next, as illustrated in FIG. 6, a molding operation S300 of forming the molding portion 400 so as to cover a region 215 to be molded, of the substrate assembly 200 may be performed. The molding portion 600 may be formed by injecting a material including an epoxy molding compound (EMC) at a high pressure.

Figure 7:
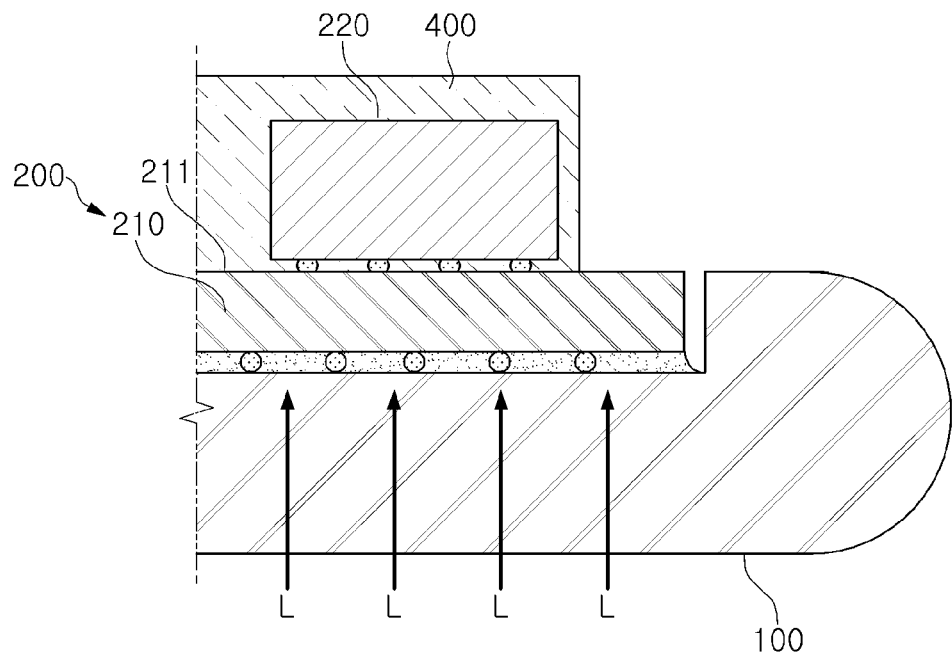

Next, as illustrated in FIG. 7, an operation S400 of separating the substrate assembly 200 from the carrier substrate 100 may be performed. Regarding separation of the substrate assembly 200, light L is irradiated onto the adhesive layer G through the carrier substrate 100, so an adhesive force of the adhesive layer G is weakened. Thus, the substrate assembly 200 may be debonded from the carrier substrate 100. According to an example embodiment, the light L may be UV light.

Figure 10:
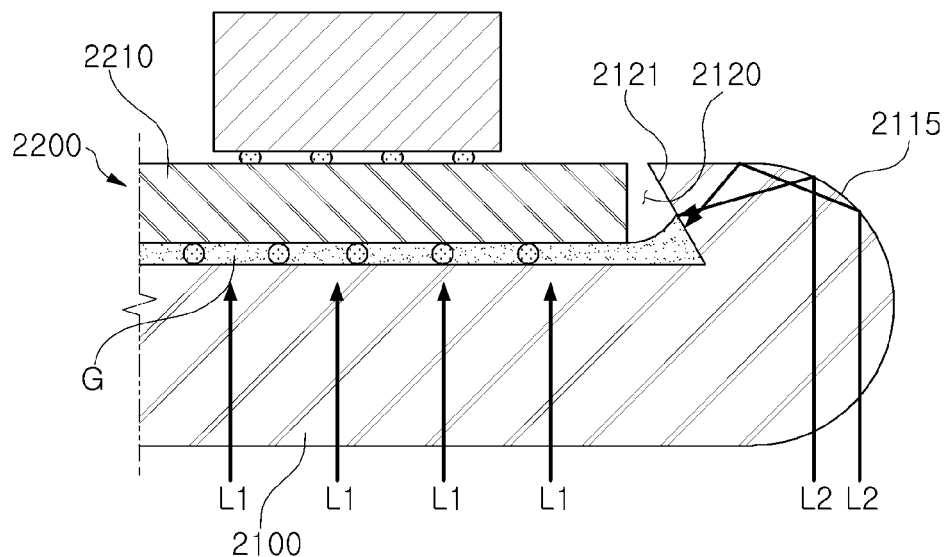
Figure 11:
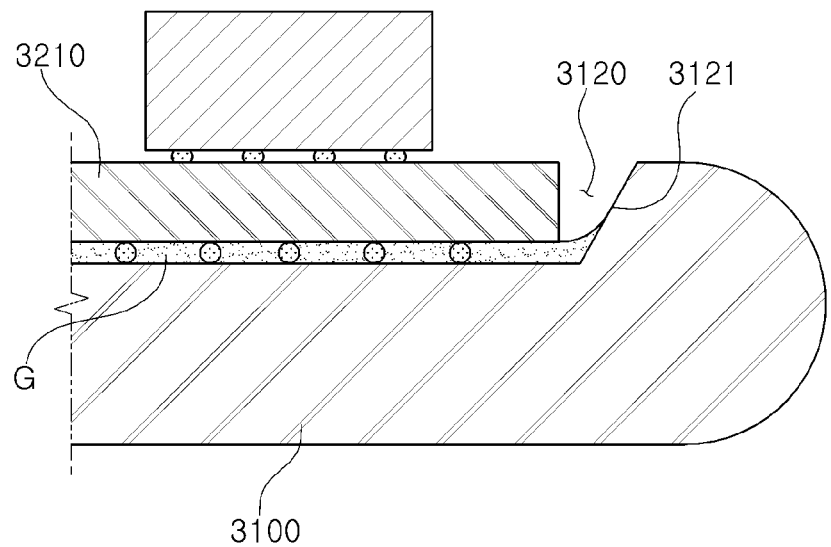
Figure 12:
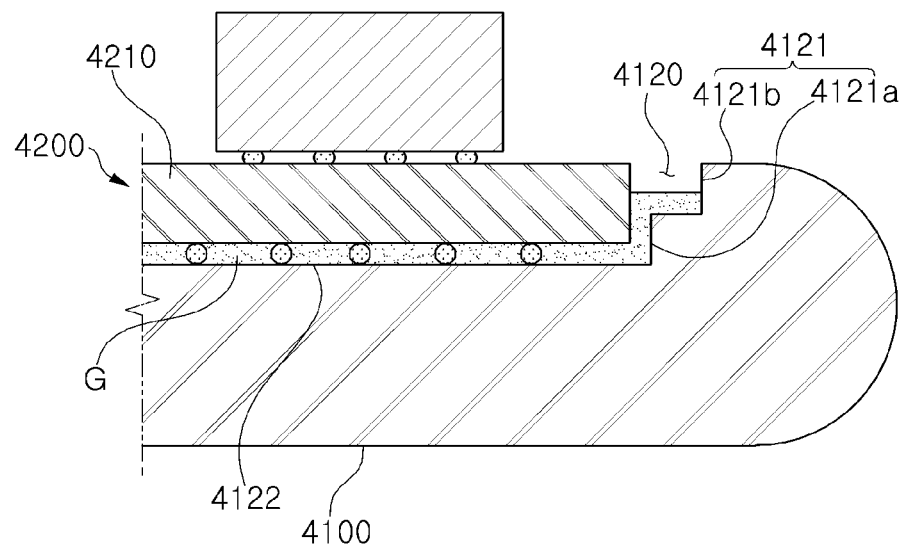

Next, various modified examples of a carrier substrate will be described with reference to FIGS. 10 to 12. FIGS. 10 to 12 illustrate various modified examples of a carrier substrate of FIG. 2. Since the carrier substrates of FIGS. 10 to 12 only differ from that of the previous embodiments in the shape of the cavity, the description below is primarily directed to the shape of the cavities of the carrier substrates.

FIG. 10 illustrates an example in which a side wall 2121 of a cavity 2120 is formed to be downwardly inclined in a radially outward direction towards an edge 2115 of the carrier substrate 2100.

If an adhesive material for attaching a substrate assembly to a carrier substrate is applied in an amount that is more than necessary, a portion of the adhesive material may overflow outside of the cavity. If a molding process is performed in the state described above, the adhesive material overflowing outside of the cavity may be attached to a clamp. The adhesive material, attached to the clamp as described above, may allow a gap in a surface with which the clamp and the substrate are in contact to be formed, in a process of molding another carrier substrate. In this case, an encapsulant is leaked through the gap in a molding process, so a molding failure may occur. In an example embodiment, a side wall of a cavity is formed to be inclined. In this regard, even when an adhesive material is applied in an amount that is more than necessary, a space in which remaining adhesive material is to be stored may be provided. Thus, a problem may be voided in which adhesive material overflows outside of a cavity of the carrier substrate.

Moreover, in the case of the modified example of FIG. 10, as previously described a side wall 2121 of the cavity 2120 is formed to be downwardly inclined in a radially outward direction towards an edge 2115 of a base of the carrier substrate 2100. Thus, among light L1 and L2 irradiated to debond the substrate assembly 2200, the light L2 is reflected from the edge 2115 of the substrate 2210, and may be incident into the cavity 2120 through the side wall 2121 of the cavity 2120. Thus, photodegradation efficiency of the light irradiated for debonding may be further improved.

A modified example of FIG. 11 is an example in which a side wall 3121 of a cavity 3120 of the carrier substrate 3100 is formed to be downwardly inclined in a radially inward direction of the carrier substrate 3100.

A modified example of FIG. 12 is an example in which a side wall 4121 of a cavity 4120 has a stepped surface having steps that extend downwardly in a radially inward direction. That is, the side wall 4121 may be provided in the form of a staircase gradually lowered in a central direction of the carrier substrate 100. In the case of the example embodiment, the side wall 4121 is formed to have a first side wall 4121a and a second side wall 4121b. In this case, the substrate 4210 of the substrate assembly 4200 may be disposed to be adjacent to the first side wall 4121a, to be extended from a bottom surface 4122 of the cavity 4120 to be accommodated in a stepped region.

While example embodiments have been shown and described above, it will be apparent to those skilled in the art that modifications and variations could be made without departing from the scope of the present disclosure, as defined by the appended claims.

What is claimed is:

1. A method for manufacturing a semiconductor device package, the method comprising:
   accommodating a substrate, with a semiconductor chip mounted thereon, in a cavity located in a center of a carrier substrate, the carrier substrate having a support portion in contact with a side wall of the cavity to form an upper surface of the side wall, the support portion surrounding the cavity, and the carrier substrate formed of a transparent material;
   defining a molding portion of the substrate by pressing the support portion and an edge region of the substrate; and
   molding the molding portion to cover the semiconductor chip.

2. The method for manufacturing the semiconductor device package of claim 1, wherein the accommodating the substrate in the cavity includes:
applying an adhesive layer to a bottom surface of the cavity; and
attaching the substrate to the bottom surface of the cavity with the adhesive layer.

3. The method for manufacturing the semiconductor device package of claim 2, wherein the attaching the substrate includes arranging a height of the support portion to be equal to or higher than the sum of a heights of the substrate and the adhesive layer.

4. The method for manufacturing the semiconductor device package of claim 1, wherein defining the molding portion includes pressing an upper surface of the support portion and the edge region of the substrate to be coplanar with each other.

5. The method for manufacturing the semiconductor device package of claim 1, wherein:
the substrate has one surface and another surface opposite thereto,
one surface is attached to a bottom surface of the cavity by an adhesive layer, and
the other surface is provided with the semiconductor chip mounted thereon.

6. The method for manufacturing the semiconductor device package of claim 5, further comprising debonding the substrate to be separated from the carrier substrate, after the molding the molding portion.

7. The method for manufacturing the semiconductor device package of claim 6, wherein:
the adhesive layer is formed of a photo-degradable material, and
in the debonding, ultraviolet (UV) light is irradiated onto the adhesive layer through the carrier substrate.

8. The method for manufacturing the semiconductor device package of claim 5, wherein the edge region to be molded is defined in the other surface.

9. The method for manufacturing the semiconductor device package of claim 1, wherein the transparent material includes at least one among glass, fused silica, and fused quartz.

10. The method for manufacturing the semiconductor device package of claim 1, wherein the side wall is spaced apart from a side surface of the substrate.

11. The method for manufacturing the semiconductor device package of claim 1, wherein the substrate is a wafer or a printed circuit board (PCB).

12. The method for manufacturing the semiconductor device package of claim 1, wherein the side wall has a surface inclined in an edge direction of a base of the carrier substrate.

13. The method for manufacturing the semiconductor device package of claim 1, wherein the side wall has a surface inclined in a central direction of a base of the carrier substrate.

14. The method for manufacturing the semiconductor device package of claim 1, wherein the side wall has a stepped surface.

15. The method for manufacturing the semiconductor device package of claim 14, wherein:
the side wall has a stepped portion in the form of a staircase gradually lowered in a central direction of a base of the carrier substrate, and
the substrate is accommodated in a region extended from a bottom surface of the cavity and stepped.

16. A method for manufacturing a semiconductor device package, the method comprising:
accommodating a substrate in a cavity located in a center of a carrier substrate, the cavity being defined by a side wall protruding along an edge of the carrier substrate, the carrier substrate including a base formed of a light-transmitting material, an upper surface of the side wall forming a surface substantially parallel with an upper surface of the substrate, and a level of the upper surface being the same as or lower than a level of the substrate;
defining a molding portion of the substrate by pressing a support portion and an edge region of the substrate to be coplanar with each other using a clamp defining a region in which the substrate is to be molded; and
molding the molding portion to cover a semiconductor chip.

17. The method for manufacturing the semiconductor device package of claim 16, wherein one surface of the substrate is attached to the cavity by an adhesive layer and another surface opposite to the one surface is provided with the semiconductor chip mounted thereon.

18. The method for manufacturing the semiconductor device package of claim 17, wherein the substrate is attached to the carrier substrate by the adhesive layer disposed in a bottom surface of the cavity.

19. The method for manufacturing the semiconductor device package of claim 16, wherein the accommodating a substrate in the cavity includes:
applying an adhesive layer to a bottom surface of the cavity; and
attaching the substrate to the bottom surface of the cavity with the adhesive layer.

20. The method for manufacturing the semiconductor device package of claim 19, wherein the attaching the substrate includes arranging a height of the support portion to be equal to or higher than the sum of a heights of the substrate and the adhesive layer.

* * * * *